(12) United States Patent
Beyne et al.

(10) Patent No.: US 6,908,856 B2
(45) Date of Patent: Jun. 21, 2005

(54) METHOD FOR PRODUCING ELECTRICAL THROUGH HOLE INTERCONNECTS AND DEVICES MADE THEREOF

(75) Inventors: Eric Beyne, Leuven (BE); Riet Labie, Kessel-Lo (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 0 days.

(21) Appl. No.: 10/817,763

(22) Filed: Apr. 2, 2004

(65) Prior Publication Data

US 2004/0259292 A1 Dec. 23, 2004

Related U.S. Application Data

(60) Provisional application No. 60/506,560, filed on Sep. 26, 2003, and provisional application No. 60/460,853, filed on Apr. 3, 2003.

(30) Foreign Application Priority Data

Apr. 3, 2003 (EP) .............................. 03447079
Sep. 25, 2003 (EP) .............................. 03447236

(51) Int. Cl.$^7$ .............................................. H01L 21/44
(52) U.S. Cl. ..................... 438/667; 438/669; 438/672; 438/673
(58) Field of Search ................. 438/667, 669, 438/672–673

(56) References Cited

U.S. PATENT DOCUMENTS

| | | | |
|---|---|---|---|
| 6,608,371 B2 * | 8/2003 | Kurashima et al. .......... 257/686 |
| 6,670,269 B2 * | 12/2003 | Mashino ..................... 438/637 |
| 2001/0001292 A1 | 5/2001 | Bertin et al. | |
| 2002/0017710 A1 | 2/2002 | Kurashima et al. | |
| 2002/0027293 A1 | 3/2002 | Hoshino | |
| 2002/0048916 A1 | 4/2002 | Yanagida | |

FOREIGN PATENT DOCUMENTS

| | | |
|---|---|---|
| EP | 1 199 744 | 4/2002 |
| JP | 61-248534 | 11/1986 |
| JP | 11 251316 | 9/1999 |
| JP | 2001 015654 | 1/2001 |

* cited by examiner

*Primary Examiner*—Luan Thai
(74) *Attorney, Agent, or Firm*—Knobbe Martens Olson & Bear LLP

(57) ABSTRACT

The invention relates to a method for the fabrication of a device comprising electrical through hole interconnects. In one embodiment, the method comprises anisotropical dry etching of a patternable dielectric material within a substrate hole. One aspect of the invention provides a novel method for producing via or through hole interconnects between microelectronic elements, which is relatively easy to perform and can be applied relatively cheaply compared to the state of the art. The method should, for instance, be applicable in thin chip technology as MCM (Multi Chip Module) and system in a package (SIP) technology.

53 Claims, 10 Drawing Sheets

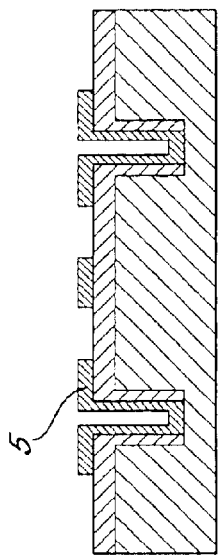
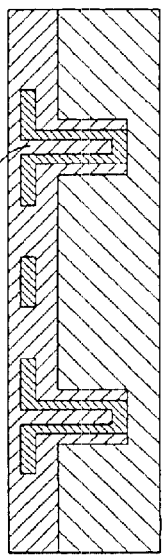
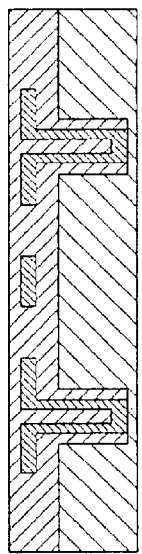
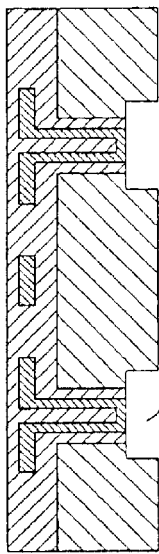
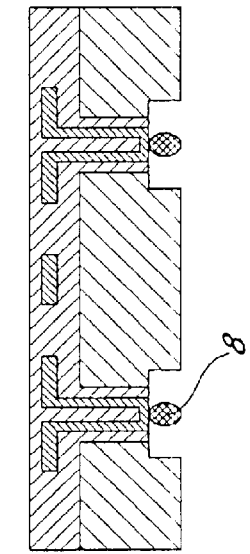
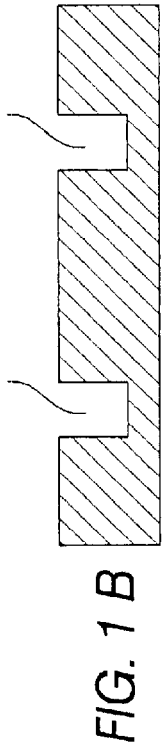
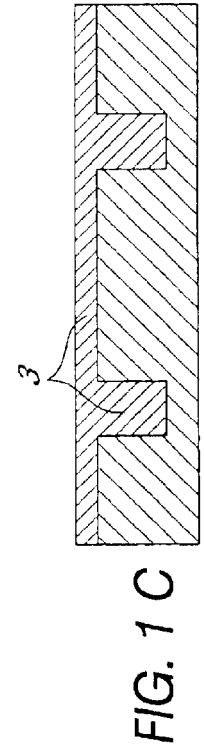
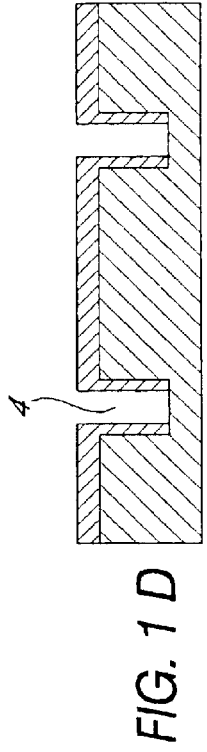
FIG. 1A FIG. 1B FIG. 1C FIG. 1D FIG. 1E FIG. 1F FIG. 1G1 FIG. 1G2 FIG. 1H

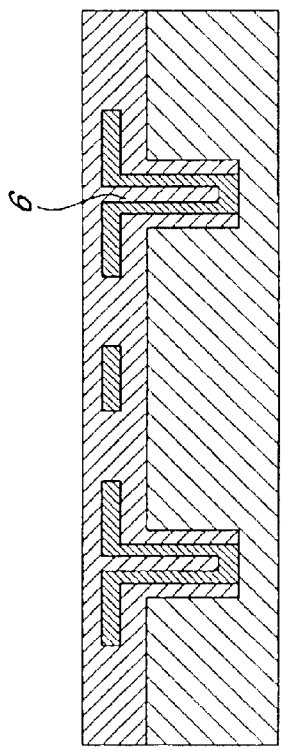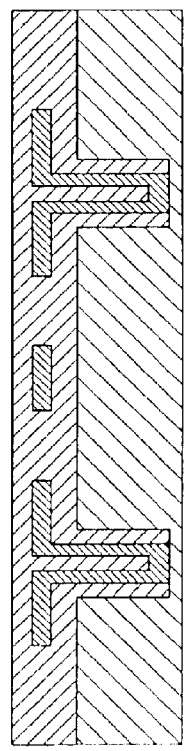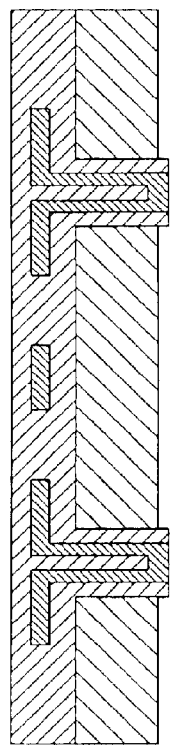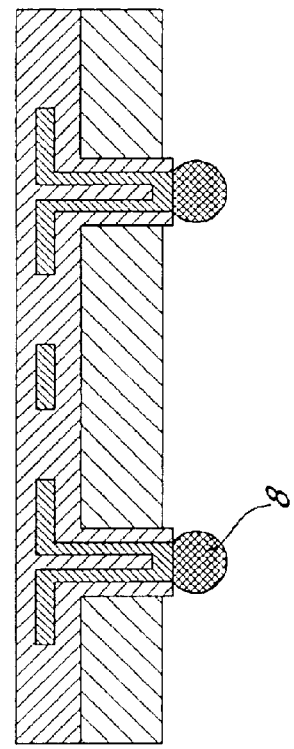
FIG. 2F  FIG. 2 G1  FIG. 2 G2f  FIG. 2 H

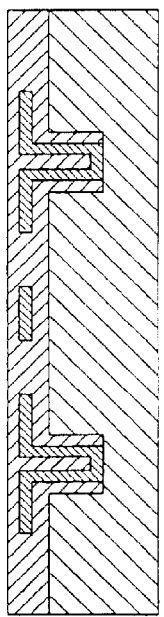
FIG. 3F
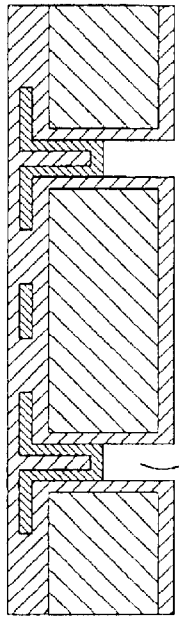
FIG. 3D*
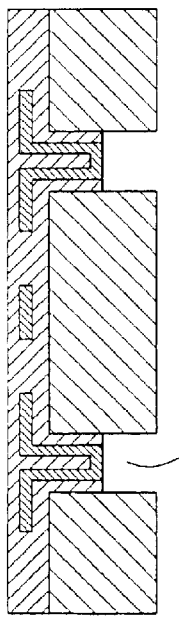
FIG. 3B*
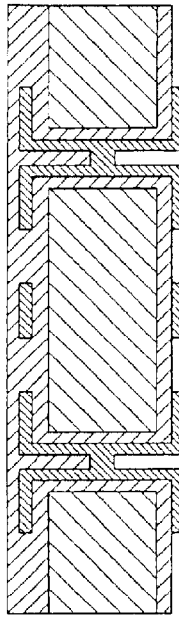
FIG. 3E*
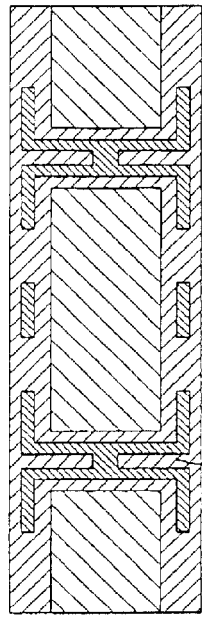
FIG. 3C*
FIG. 3F*

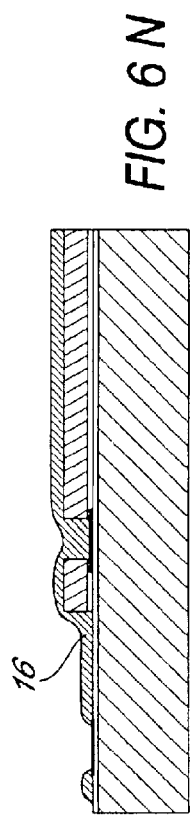
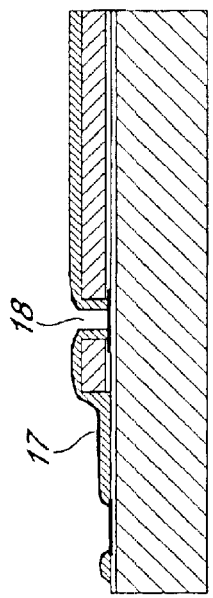
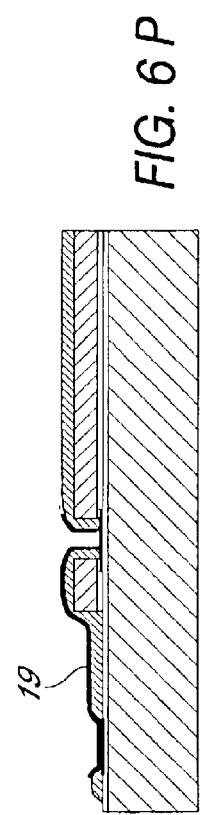
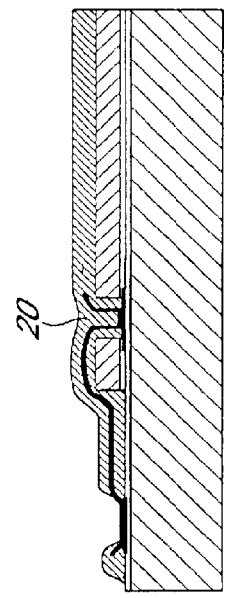
FIG. 6N
FIG. 6O
FIG. 6P
FIG. 6Q
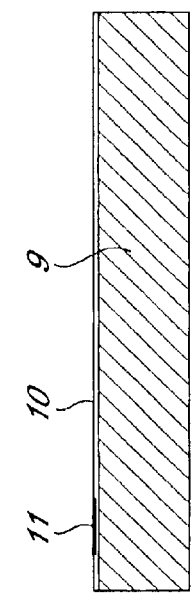
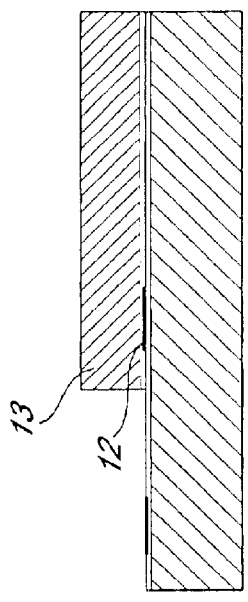
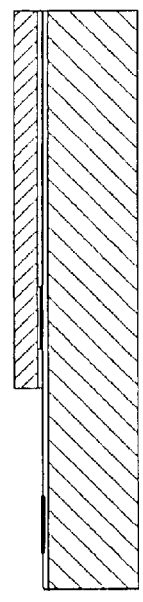
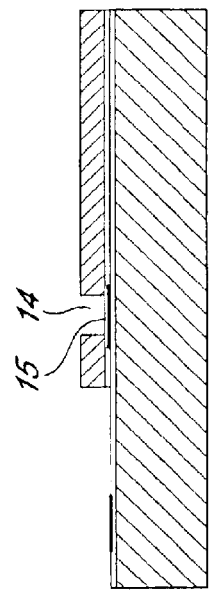
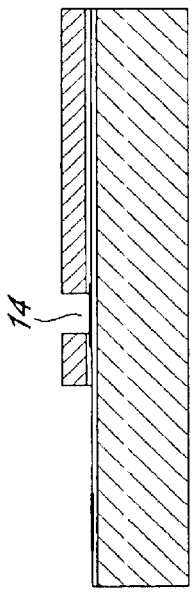
FIG. 6I
FIG. 6J
FIG. 6K
FIG. 6L
FIG. 6M

METHOD FOR PRODUCING ELECTRICAL THROUGH HOLE INTERCONNECTS AND DEVICES MADE THEREOF

RELATED APPLICATIONS

This application claims priority under 35 U.S.C. § 119(e) from provisional applications Nos. 60/460,853 and 60/506,560, filed Apr. 3, 2003 and Sep. 26, 2003, respectively, which are hereby incorporated by reference.

BACKGROUND OF THE INVENTION

1. Field of the Invention

The present invention relates to the field of electrical interconnection technologies for microelectronics system elements. In particular, the present invention relates to methods for producing electrical through hole interconnects.

2. Description of the Related Technology

The evolution of VLSI technology calls for an increasing bandwidth of interconnects between IC's and/or other system elements. For short interconnects, electrical signal lines maintain the highest capacity and speed. In order to keep up with the increasing speed and density requirements, system in a package (SIP) technology is increasingly used. This creates the need for 3-dimensional interconnects.

An example of the fabrication of such interconnects can be found in U.S. Pat. No. 6,184,060. Vias or through holes are made in the front side of the wafer, and dielectric and contact pad metal are deposited into the vias. Then the wafer back side is etched until the back metal is exposed. This method requires the back side to be etched up to the contact pad, including etching the dielectric deposited on the bottom of the vias. The patent indicates silicon oxide or BPSG as material for the dielectric, deposited by CVD (Chemical Vapor Deposition). Also thermal oxidation is mentioned. Etching silicon oxide with respect to silicon is not trivial and cannot be done anistropically. Silicon oxide deposition produces layers with essentially uniform thickness, which limits design freedom.

SUMMARY OF CERTAIN INVENTIVE ASPECTS OF THE INVENTION

One aspect of the invention provides a novel method for producing via or through hole interconnects between microelectronic elements, which is relatively easy to perform and can be applied relatively cheaply compared to the state of the art. The method should, for instance, be applicable in thin chip technology as MCM (Multi Chip Module) and system in a package (SIP) technology.

Another aspect of the invention provides a method for the fabrication of a device comprising electrical through hole interconnects. In one embodiment, the method comprises:

(A) providing a substrate, (B) dry etching said substrate so as to form at least one substrate hole, (C) depositing a first layer of a first patternable dielectric material on said substrate, said substrate hole thereby being filled, (D) anisotropically dry etching in said first layer of patternable dielectric material within said substrate hole, forming at least one dielectric hole within said substrate hole, whereby the sidewalls of said substrate hole remain covered with said first layer of a first patternable dielectric material; until the bottom of said substrate hole is reached, (E) depositing a layer of conducting material on the bottom and on the sidewalls of said dielectric hole, thereby transforming said dielectric hole into a conductor hole, and (F) depositing a second layer of a second patternable dielectric material on top of said layer of conducting material, said conductor hole being filled.

Preferably at least two of said dielectric holes within the same substrate hole define interconnects, between which a predetermined electromagnetic field is created when they carry a signal.

In one embodiment, the dielectric holes within the same substrate hole can define an N-fold coaxial cable interconnect, wherein typically N equals 2.

In one embodiment, the method further comprises (G) dry etching said substrate from the back side, until said conducting material is reached.

Another aspect of the invention provides a method for the fabrication of a device comprising electrical through hole interconnects. In one embodiment, the method comprises:

i) performing the method as described above on the front side of said substrate, forming at least one substrate hole in said front side, and ii) performing the method on the back side of said substrate, forming at least one substrate hole in said back side, said substrate hole in said back side being aligned with said substrate hole in said front side, thereby producing isolated through hole interconnects passing from said front side of said substrate to said back side of said substrate.

In another embodiment, the method further comprises:

(I) anisotropically dry etching in a previous layer of patternable dielectric material within a previous conductor hole formed by a previous layer of conductive material, forming at least one dielectric hole within said previous conductor hole, whereby the sidewalls of said previous conductor hole remain covered with said previous layer of patternable dielectric material, until the bottom of said previous conductor hole is reached, (J) depositing a next layer of conducting material on the bottom and on the sidewalls of said dielectric hole in said previous layer of patternable dielectric material, thereby transforming said dielectric hole into a conductor hole, and (K) depositing a next layer of a further patternable dielectric material on top of said next layer of conducting material, said conductor hole thereby being filled.

In another embodiment, the method further comprises:

(L) anisotropically dry etching in a previous layer of patternable dielectric material within a previous conductor hole formed by a previous layer of conductive material, forming at least one dielectric hole within said previous conductor hole, whereby the sidewalls of said previous conductor hole remain covered with said previous patternable dielectric material, until the bottom of said previous conductor hole is reached, (M) removing said conducting material from the bottom of said dielectric hole until said substrate is exposed on the bottom of said dielectric hole, (N) depositing a next layer of a further patternable dielectric material, whereby said dielectric hole is filled, (O) anisotropically dry etching in said next layer of patternable dielectric material within said dielectric hole, forming a new dielectric hole within said dielectric hole, whereby the remaining portion of said dielectric hole remain covered with said next layer of patternable dielectric material, until the bottom of said substrate hole is reached, (P) depositing a next layer of conducting material on the bottom and on the sidewalls of said new dielectric hole in said next layer of patternable dielectric material, thereby transforming said new dielectric hole into a conductor hole, and (Q) depositing a next layer of a further patternable dielectric material on top of said next layer of conducting material.

In an advantageous embodiment the method reapplies (I), (J) and (K) for a finite number of times and the back side of said substrate optionally is thinned up until a level (LA) is high enough such that the conducting material on the bottom of said layers of conducting material is removed.

Alternatively the method reapplies (L)–(Q) for a finite integer number of times, whereby optionally the back side of said substrate is thinned up until a level (LB) is high enough such that the conducting material on the bottom of said layers of conducting material is removed.

The conducting material preferably is copper.

Any of (E), (J) or (P) typically creates an interconnection with an external contact.

In one embodiment, the first, the second and further dielectric materials are chosen from the group consisting of polymer and silicone. Advantageously the polymer is benzocyclobutene. Said dielectric materials preferably are deposited by spin coating or spray coating or lamination. More preferably they are the same dielectric material.

The substrate preferably is a processed substrate and more preferably a semiconductor substrate. Most preferably it is a silicon substrate.

In one embodiment, the substrate hole is circular shaped. In one embodiment, said dielectric hole is circular or ring shaped. The dielectric hole and said substrate hole preferably are concentric. In one embodiment, the width of said dielectric hole (4) is between 15 $\mu$m and 40 $\mu$m.

In one embodiment, patterning of the patternable dielectric material typically is performed by plasma-etching or lithography techniques.

Another aspect of the invention provides a chip to wafer bonding and more specifically to an interconnect scheme for already bonded chips. In one embodiment, this method for the fabrication of a device comprising electrical through hole interconnects comprises:

I) providing a substrate, typically covered by an oxide layer and comprising an open contact, J) bonding a silicon die to said substrate, whereby said silicon die has an internal contact or an internal contact is created, said internal contact being isolated by a first layer of a first dielectric material, K) thinning said bonded silicon die without revealing said internal contact, L) dry etching said silicon die so as to form at least one substrate hole, until said first layer of said first dielectric material in said internal contact is reached, M) dry etching said first layer of said first dielectric material at the bottom of said substrate hole, N) depositing a second layer of a second dielectric material, said substrate hole thereby being filled, O) depositing and patterning a thin aluminum hard-mask layer, and dry etching in said second layer of said second dielectric material within said substrate hole in said silicon die so as to form a dielectric hole within said substrate hole, whereby the sidewalls of said substrate hole remain covered with said second layer of said second dielectric material, until the bottom of said substrate hole is reached, P) depositing a thick aluminum layer, creating an interconnect between said open contact and said internal contact, thereby transforming said dielectric hole into a conductor hole, and etching said thick aluminum layer, and Q) depositing a third layer of a third dielectric material, thereby filling said conductor hole.

The substrate preferably is a silicon wafer. In one embodiment, the substrate hole is circular shaped.

In one embodiment, the internal contact is created by flipping said silicon die with an aluminum pad on its upper surface, said aluminum pad being covered with an oxide layer. In one embodiment, the dry etching the silicon die is then performed by etching through the silicon die until the oxide layer is reached. In one embodiment, the dry etching the first layer of first dielectric material is performed by etching said oxide layer.

In a preferred embodiment, the second and the third dielectric material is benzocyclobutene (BCB) and the second layer of said second dielectric material and the third layer of said third dielectric material is deposited by BCB spin coating or spray coating. In another embodiment, the dielectric materials include silicon and parylene. In this embodiment, the materials can be deposited by spin coating or spray coating.

Another aspect of the invention provides a method for the production of isolated through hole connects in a substrate. In one embodiment, the method comprises:

A) providing a substrate,

B) dry etching said substrate so as to form at least one substrate hole,

C) depositing a layer of conducting material on the bottom and on the sidewalls of said substrate hole and possibly on top of the rest of said substrate's surface, thereby transforming said substrate hole into a conductor hole, D) depositing a positive working photo resist, E) opening said photo resist at the bottom of said conductor hole, F) bottom-up electroplating a Cu-post, G) stripping said photo-resist, H) stripping said layer of conducting material, I) depositing a layer of planarising dielectric material, filling the gap between said conductor hole and said Cu-post, K) depositing and patterning a metal interconnect pattern, L) depositing a second layer of a second dielectric material, M) mechanical back grinding said substrate, such that said substrate is about 10 to 50 micrometer thicker than the actual Cu-post, N) plasma etching said substrate on the back side, stopping on said Cu-post, and O) attaching at least one solder ball to said Cu-post.

Advantageously the positive working photo resist is applied by spray-coating or electrophoretic deposition. In one embodiment, the opening of said photo resist is done by UV illumination through a mask.

In a preferred embodiment, the method further comprises patterning by dry etching said layer of planarising dielectric material, exposing said Cu-post, before applying the depositing, and patterning a metal interconnect pattern.

Another aspect of the invention provides an alternative method for the production of isolated through hole connects in a substrate. In one embodiment, the method comprises:

A) providing a substrate,

B) dry etching said substrate so as to form at least one substrate hole,

C) depositing a layer of conducting material on the bottom and on the sidewalls of said substrate hole and possibly on top of the rest of said substrate's surface, thereby transforming said substrate hole into a conductor hole, D) depositing a layer of planarising dielectric material, filling said conductor hole and planarising said substrate, E) plasma etching in said layer of planarising dielectric material within said conductor hole, until the conducting material at the bottom of said conductor hole is removed, thereby transforming said conductor hole into a dielectric hole, F) bottom-up electroplating a Cu-post, G) stripping said layer of planarising dielectric material, H) stripping said layer of conducting material, J) depositing and patterning a metal interconnect pattern, K) depositing a second layer of a second dielectric material, L) mechanical back grinding said substrate, M) plasma etching said substrate on the back side, stopping on said Cu-post, N) etching said layer of conductive material on the back-side of said substrate, and O) attaching at least one solder ball to said Cu-post.

In a preferred embodiment, the photo-patterned dielectric layer is photo benzocyclobutene. Advantageously, the method further comprises depositing a photo-patterned dielectric layer, with contact openings on said Cu-post, before applying the depositing, and patterning a metal interconnect pattern.

The substrate preferably is a silicon wafer. The substrate hole typically is circular shaped.

The dry etching of said substrate may advantageously be performed by Reactive Ion Etching—Inductive Coupled Plasma (RIE-ICP). Typically the conducting material is copper. The planarising dielectric material and said second dielectric material is preferably benzocyclobutene (BCB). Preferably said second dielectric material is non-photo benzocyclobutene (BCB). In one embodiment, the metal interconnect pattern is formed by semi-additive electroplated copper lines. In the plasma etching said substrate on the back side, the substrate is preferably over-etched.

Another aspect of the invention provides a device comprising electrical through hole interconnects fabricated by any of the methods as described above. Another aspect of the invention provides an electrical through hole connect, produced by any of the above-described methods.

BRIEF DESCRIPTION OF THE DRAWINGS

FIG. 1 (steps 1A to 1F) illustrates a first embodiment of the present invention. Steps 1G and 1H illustrate preferred further optimal steps of the method of the present invention.

FIG. 2 represents an embodiment with optimal further steps 2G and 2H of the method of the present invention.

FIG. 3 represents an embodiment, wherein the method is also applied on the back side of the substrate.

FIG. 6 represents an embodiment related to chip to wafer bonding.

DETAILED DESCRIPTION OF CERTAIN EMBODIMENTS OF THE INVENTION

Figure 4:
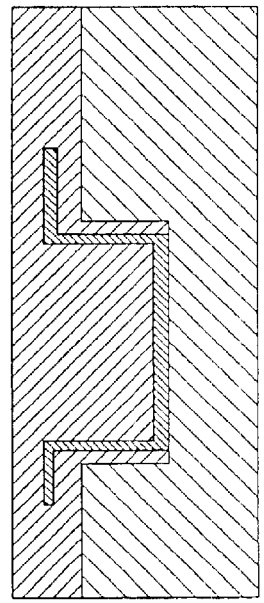
FIG. 4 represents a sequence of steps according to another embodiment with several layers of dielectric and conducting material.
Figure 4:
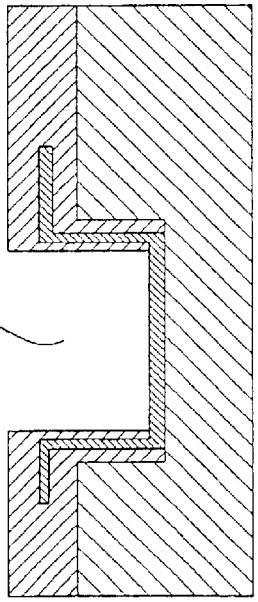
Figure 4:
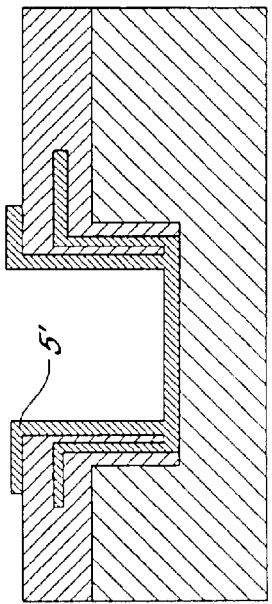
Figure 4:
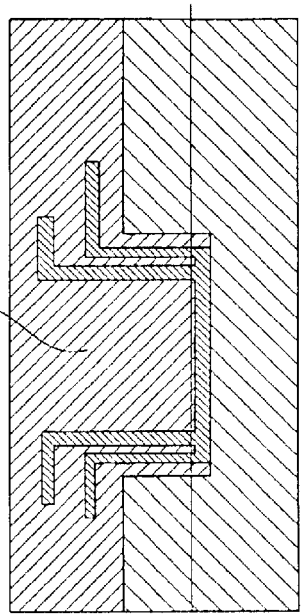
Figure 4:
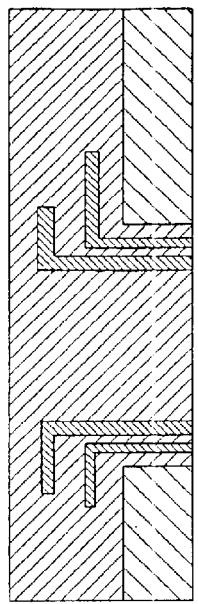

The embodiments and examples described below do not limit the scope of the idea and they can be slightly changed by ordinary steps known in the art in order to optimize applicability in specific practical situations. Some preferred practical embodiments are described below.

For the purpose of this invention, the terms 'next layer of dielectric/conducting material' and 'previous layer of dielectric/conducting material' should be understood as the next or previous layer of dielectric/conducting material, respectively, with respect to the moment of deposition. Furthermore the term 'patternable' means that the layer can be patterned. Typically this should be possible at a scale smaller than the hole size. Preferably the patterning of said patternable dielectric material is performed by plasma-etching and/or lithographic techniques. The term 'dielectric hole' is used for a hole whereof the sidewalls are covered with a dielectric material, whereas a 'conductor hole' has sidewalls and bottom covered with a layer of conducting material.

The various steps of the method are numbered in capitals, starting from A). However, it is not always obligatory to perform all steps in alphabetical order, as some steps can constitute an alternative to certain steps that were previously mentioned. The numbering rather refers to that used in the figures.

In a first preferred aspect of the present invention, a method is disclosed to make isolated through holes or vias in a substrate. In summary, through holes are fabricated according to a preferred embodiment as follows:

dry etching holes in Si-wafer (e.g., 25–50 micron), benzocyclobutene (BCB) coating & hole filling, dry etching BCB holes concentric to Si-holes (e.g., 15–40 micron), depositing seed layer & electroplating thick copper (e.g., 5–10 micron), providing an additional BCB passivation layer.

Advantageously another step can be added, namely a step of dry etching Si from the wafer back side, stopping on the copper.

Each step of the method is now described more in detail.

In various inventive embodiments, the method preferably comprises the following(see FIG. 1):

A) providing a substrate (1) (FIG. 1A); the substrate can be a wafer or a processed wafer. It can be a microelectronics component, possibly bonded to a wafer. Preferably the substrate is a semiconductor substrate. More preferably the substrate is a silicon substrate. Preferably the substrate thickness is between 10 $\mu$m and 500 $\mu$m. More preferably the substrate thickness is between 20 $\mu$m and 300 $\mu$m.

B) dry etching in said substrate, forming at least one substrate hole (2). These substrate holes (2) can have different shapes and dimensions in the same substrate (1). The etching can be performed by different methods known in the state of the art. For instance Reactive Ion Etching—Inductive Coupled Plasma (RIE-ICP) can be used. Preferably these holes are cylindrical, corresponding to a circular opening on the surface (FIG. 1B). The holes have a width of 25 $\mu$m, but bigger and smaller holes are possible. Preferably the holes have a width between 20 $\mu$m and 100 $\mu$m. Typical holes can have an aspect ratio of 1:5, the aspect ratio being defined as width/depth$|_{hole}$. Aspect ratios of 1:10 or higher are not excluded. A vacuum step may be added to ensure proper filling of the Si substrate holes. For benzocyclobutene (BCB) this is preferably performed at 170° C., as this material exhibits its largest flow at that temperature, before it starts to cure at higher temperatures. An alternative method could be the lamination of a dielectric layer, followed by a vacuum reflow step, filling the holes and planarising the substrate in a single step.

C) depositing a first layer of patternable dielectric material (3) on said substrate (1), whereby said substrate holes (2) are filled and the substrate surface is planarised (FIG. 1C). Advantageously the patternable dielectric material is a polymer or silicone. The dielectric material is preferably deposited by spin-coating, spray-coating or lamination techniques. More preferably the patternable dielectric is benzocyclobutene (BCB). Even more preferably non-photo BCB is used for this step, due to its good hole filling and planarisation properties. One or multiple coatings can be required. In one embodiment, the method further comprises spray-coating a polymer layer or a silicone layer on the substrate (1). In one embodiment, the polymer layer is photo-patternable in the substrate holes (2). In this embodiment, the method further comprises patterning the bottom of the holes (2) by photo-lithography (FIG. 1D). In one embodiment, use of the polymer layer has an advantage over inorganic layers that the polymer layer has relatively low capacitance (low k value and relatively large thickness) and is subject to less mechanical stress (Cu through holes fully filled with inorganic layers can lead to high thermal stress).

D) anisotropically dry etching in the first layer of patternable dielectric material (3) within the substrate hole, forming at least one dielectric hole (4) within the substrate hole (2) (FIG. 1D). The sidewalls of the substrate hole (2) hereby remain covered with said first layer of patternable dielectric material (3), until the bottom of said substrate hole (2) is reached. The dielectric hole (4) can have any shape and different shapes of holes can be present in the same dielectric layer. Several dielectric holes (4) can be present in the same substrate hole. Preferably the holes (4) are circular or ring shaped. Preferably the substrate hole (2) and the dielectric hole (4) in the first layer of patternable dielectric material (3) are positioned coaxially.

E) depositing a layer of conducting material (5) on the bottom and on the sidewalls of the dielectric hole in the layer of patternable dielectric material, whereby the dielectric hole (4) is transformed into a conductor hole (FIG. 1E). This step is preferably performed by depositing a seed layer and performing electroplating of the conducting material. This step can cover the whole surface of the wafer. This step may also be performed for instance by Chemical Vapor Deposition (CVD), by Physical Vapor Deposition (PVD), Electro Chemical Deposition (ECD), sputtering techniques as well as by any other method known in the art. Preferably the conducting material (5) is a metal. More preferably the conducting material (5) is copper or aluminum. The step of depositing a conducting material possibly creates an interconnect with an external contact. This step can comprise various substeps. Typically physical vapor deposition (PVD) of e.g. a plating seed layer of 30 nm Ti/400 nm Cu is used. The thickness of the Cu on the sidewalls and bottom of the holes may be increased by using electroless Cu plating. This is followed by the deposition of a resist layer, in order to perform pattern plating. After plating the resist and the plating seed layer are stripped from the wafer.

In an alternative embodiment the above-mentioned (C), (D), and (E) are replaced by applying Resin Coated Foils, preferably Resin Coated Copper foils. These foils are positioned on top of the substrate, after which they are pressed against the substrate, and thereby fill the hole(s) with a first layer of resin (preferably BCB) and a copper layer.

F) depositing a second layer of a second patternable dielectric material (6) on top of the layer of conducting material (5), hereby filling the gap in the obtained through hole metal fill (FIG. 1F). This layer can serve as an external isolation layer. Preferably the second patternable dielectric material is a polymer or silicone. The dielectric material is preferably deposited by spin-coating, spray-coating or lamination techniques. More preferably the second patternable dielectric is benzocyclobutene (BCB) as it has excellent planarisation and gap fill properties. A vacuum step can be added to ensure proper filling of the gaps for instance between the Cu and the Si. For BCB this is preferably performed at 170° C. as the material exhibits its largest flow at that temperature, before it starts to cure at higher temperatures. Preferably the first (3) and second (6) patternable dielectric material are the same.

For the interconnects, an aspect ratio (defined as width/depth$|_{interconnect}$) of 1:5 even 1:10 is easily achievable. Aspect ratios of 1:20 and more can be achieved.

Preferably the present invention further comprises optional steps such as a wafer backgrinding step (FIG. 1G1=FIG. 2G1) (preferably until the wafer is about 10 $\mu$m to 50 $\mu$m thicker than the metal via post).

According to a preferred embodiment, the method further comprises:

G) dry etching or plasma etching the substrate from the back side, hereby possibly creating holes (7) and halting when the conducting material and dielectric material are reached (FIG. 1G2). Even more preferably the plasma etching does not stop after that the level where the conducting material and dielectric material are reached (for instance copper/BCB plugs), but continues above that level (thus slightly overetching the silicon) (FIG. 2G2f). The conducting material and dielectric material will then come out of the etched back surface, which is advantageous for the addition of solder bumps.

H) The addition of solder bumps (8) on the studs of conducting material, for bonding purposes (FIG. 1H and FIG. 2H).

In another embodiment of the present invention (FIG. 3) the method as previously described is applied first on the front side of a substrate (resulting in FIG. 3F=FIG. 2F=FIG. 1F), followed by applying the method on the back side (steps B*, C*, D*, E* and F*, respectively), whereby the holes in front and back side (2 and 2*, 4 and 4*, respectively) are co-aligned and 2* is created such that it reaches the conducting material layer (5), such that isolated through hole interconnects are produced passing from the front side of said substrate to the back side of said substrate. Doing so the aspect ratios achievable by a single process can be essentially doubled. For the interconnect aspect ratios of 1:20 are then easily achievable. Aspect ratios of 1:40 and more can even be achieved.

In preferred embodiments different dielectric holes and thus corresponding interconnects are present in one substrate hole and the dielectric holes are made such that a predetermined electromagnetic field is created between the different interconnects when they carry a signal.

In preferred embodiments the interconnect structures are made such that coaxial cable interconnects are produced. Coaxial interconnects that are able to carry signals with frequencies up to 77 GHz and even up to 100 GHz can be achieved when using BCB as dielectric material.

In preferred embodiments N-fold interconnects can be provided by creating ring shaped, coaxial dielectric holes or variations thereof. In typical embodiments N equals 2.

The dielectric holes can be completely filled with conducting material.

In another embodiment of the present invention (FIG. 4), the method comprises—starting from the situation in FIG. 4F—the following:

I) anisotropically dry etching in the previous layer of patternable dielectric material within a previous conductor hole formed by a previous layer of conductive material, such that at least one dielectric hole (4') is formed within the previous conductor hole. The sidewalls of the previous conductor hole remain covered with the previous layer of patternable dielectric material, until the bottom of said previous conductor hole is reached. (FIG. 4D')

J) depositing a next layer of conducting material (5') on the bottom and on the sidewalls of said dielectric hole in said previous layer of patternable dielectric material, thereby transforming the dielectric hole (4') into a conductor hole (FIG. 4E'). This step (j) can create an interconnection with an external contact.

K) depositing a next layer of a further patternable dielectric material (6') on top of said next layer of conducting material deposited in the previous step (FIG. 4F'). An additional step of thinning the substrate from the back side up until a level LA is reached, is preferred (FIG. 4G'). In one embodiment, the level LA is high enough such that the material on the bottom of the different layers of conducting material are removed. This way, one embodiment of the invention allows making 'coaxial cable' interconnects.

According to another embodiment of the present invention, the set of steps (I, J, K) are repeated for a finite integer number of times N, such that N-fold electrical interconnects are produced. An additional step of thinning the substrate from the back side until at least a level LA is reached is preferred. This way, one embodiment of the invention allows making N-fold 'coaxial cable' interconnects.

Figure 5:
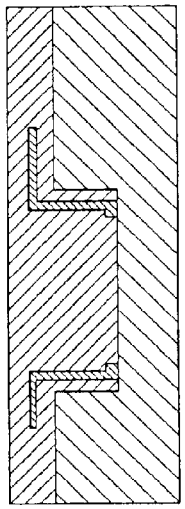
FIG. 5 represents an alternative to the embodiment of FIG. 4.
Figure 5:
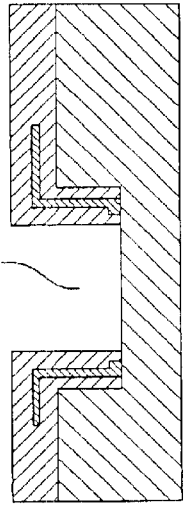
Figure 5:
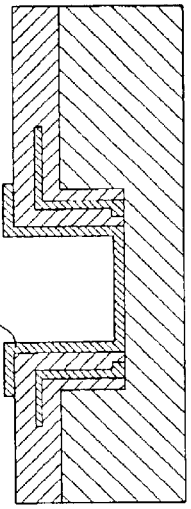
Figure 5:
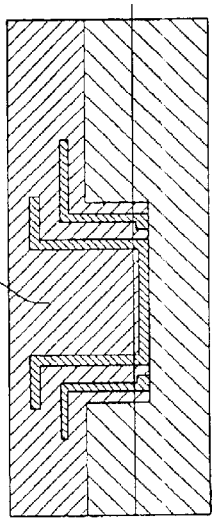
Figure 5:
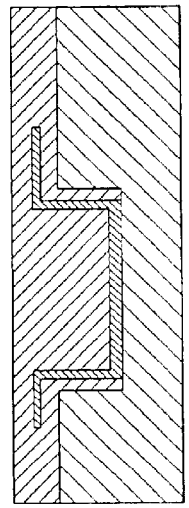
Figure 5:
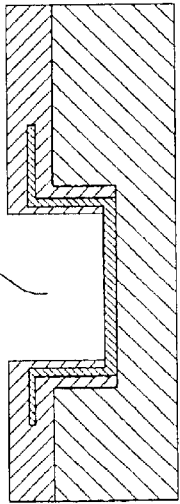
Figure 5:
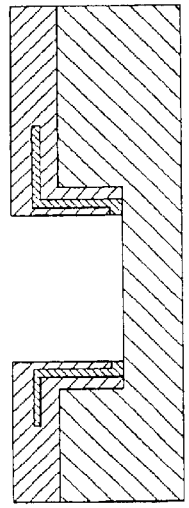

According to another embodiment of the present invention represented in FIG. 5, the method comprises—starting from the situation in FIG. 5F—the following:

L) anisotropically dry etching in the previous layer of patternable dielectric material within the previous conductor hole formed by the previous layer of conductive material, forming at least one dielectric hole (4') within said previous conductor hole. The sidewalls of the previous conductor hole remain covered with said previous patternable dielectric material, until the bottom of the previous conductor hole is reached (FIG. 5D').

M) removing the conducting material from the bottom of the dielectric hole until the substrate material is reached on the bottom of the dielectric hole (FIG. 5Da).

N) depositing a next layer of a further patternable dielectric material, whereby the dielectric hole is filled (FIG. 5Db).

O) anisotropically dry etching in the next layer of patternable dielectric material within the dielectric hole, forming a new dielectric hole (4'b) within the dielectric hole (4') such that the remaining portion of the dielectric hole (4') remains covered with the next layer of patternable dielectric material, until the bottom of the substrate holes is reached (FIG. 5Dc).

P) depositing a next layer of conducting material (5') on the bottom and on the sidewall of said new dielectric hole (4'b) in said next layer of patternable dielectric material, thereby transforming said new dielectric hole (4'b) into a conductor hole (FIG. 5E").

Q) depositing a next layer (6') of a further patternable dielectric material on top of said next layer of conducting material (5') (FIG. 5F").

An additional step of thinning the substrate from the back side up until a level LB is reached is preferred. In one embodiment, the level LB is high enough such that the material on the bottom of the different layers of conducting material are removed. This way one embodiment of the invention again allows making 'coaxial cable' interconnects.

According to another embodiment of the present invention, the set of steps (L, M, N, O, P, Q) according to the previous embodiment can also be repeated for a finite integer number of times (n), such that n-fold electrical interconnects can be produced.

An additional step of thinning the substrate from the back side up until a level LB is reached is preferred. Step (P) can advantageously create an interconnection with an external contact. This way one embodiment of the invention allows again making n-fold 'coaxial cable' interconnects.

One embodiment of the present invention offers different advantages. It allows the production of multiple metal connections through a single Si hole. For example it allows for radio frequency (RF) coax transitions.

Another aspect of the present invention provides a chip to wafer bonding and more specifically to an interconnect scheme for already bonded chips. In one embodiment, it comprises the following (FIG. 6):

I) providing a substrate (9), e.g. a silicon wafer, typically covered by an oxide layer (10), which comprises an open contact (11) (FIG. 6I), J) performing silicon die (13) to wafer bonding next to the open contact, whereby the silicon die has an internal contact (12) or an internal contact (12) is created. For example, the internal contact can be created by flipping a die with an aluminum pad on its upper surface (FIG. 6J), which is typically first covered with an oxide layer. The internal contacts are typically isolated by a first layer of dielectric material, K) thinning the bonded die on wafer level. Hereby the internal contact is not revealed (FIG. 6K), L) dry etching in the thin Si-die (14), forming a preferably circular substrate hole (20–40 micron diameter), until the dielectric isolation layer of the internal contact is reached. In the flip-chip example this means etching through the die until the oxide layer covering the Al pads (15) is reached (FIG. 6L), M) etching the first layer of dielectric material, which is isolating the internal contact, at the bottom of the substrate hole. In the flip-chip example this means etching the oxide layer covering the Al pads (15) (FIG. 6M), N) BCB spin coating on wafer level, hereby filling the substrate hole(s) (14) and creating a layer of BCB (16) (FIG. 6N), O) depositing and patterning a thin aluminum hard-mask layer (17) (FIG. 6O), and dry etching in the layer of BCB (18) within the substrate hole in the die, forming a dielectric hole (10–20 micron diameter) within said substrate hole, whereby the sidewalls of the substrate hole remain covered with BCB, until the bottom of said substrate holes is reached (FIG. 6O), P) depositing a thick aluminum layer (19) with good step coverage. This step is creating the interconnect between the open contact (11) and the internal contact (12), thereby transforming the dielectric hole into a conductor hole (FIG. 6P), and etching the thick aluminum layer (19), and Q) depositing an additional BCB passivation layer (20) by spin coating BCB, thereby filling the conductor hole (FIG. 6Q).

Another aspect of the invention provides a method for making isolated through holes or vias in a substrate. The method comprises according to a preferred embodiment the following (FIG. 7):

A) providing a substrate (1), preferably a Si wafer, possibly a processed substrate (FIG. 7A)

B) dry etching said substrate, typically by RIE-ICP, forming at least one substrate hole (2). Advantageously the substrate hole is cylindrical, but other shapes are also possible. A typical hole will have a diameter of 20 to 100 micrometer and an aspect ratio (width to depth) of up to 1:5. (FIG. 7B)

C) depositing a layer of conducting material (15) on the sidewalls and the bottom of the substrate hole(s), thereby transforming said substrate hole (2) into a conductor hole, and on the rest of the wafer surface. The step is preferably performed by depositing a seed layer and performing electroplating of the conducting material. Typically physical vapor deposition (PVD) of e.g. 30 nm Ti/400 nm Cu will be used, Cu being a preferable conducting material aluminum is an alternative conducting material. The thickness of the Cu on the sidewalls and bottom of the holes may be increased by using electroless Cu plating. (FIG. 7Cx)

D) depositing a positive working photo resist (22). This layer can be applied by spin-coating, but the application by spray-coating or electrophoretic deposition is to be preferred. A typical thickness of this resist is 5 to 10 micrometer. (FIG. 7Dx)

E) opening the photo resist (22) at the bottom (23) of the hole by UV illumination through a mask. (FIG. 7Ex)

F) bottom-up electroplating a Cu-post (24), with a thickness approximately equal to the depth of the Si hole. In case of a cylindrical hole, this is a Cu cylinder. (FIG. 7Fx)

G) stripping the photo-resist layer. (FIG. 7Gx)

H) stripping the seed layer (conducting material layer) by wet chemical etching. During this etch the Cu via-fill can be slightly etched-back. (FIG. 7Hx)

I) depositing a layer of planarising dielectric material (25), filling the gap between the Si substrate and the Cu post (FIG. 7Ix). A preferred dielectric for this application is BCB, as it has excellent planarisation and gap fill properties. A vacuum step is required to ensure proper filling of the gaps between the Cu and the Si. For BCB this is preferably performed at 170° C. as the materials exhibits its largest flow at that temperature, before it starts to cure at higher temperatures.

J) patterning by dry etching said layer of planarising dielectric material (25), exposing the Cu-post structures (FIG. 7Jx). If the layer in I is photo-defined BCB, this step is not required.

K) depositing and patterning a metal interconnect pattern (26) (FIG. 7Kx). This could e.g. be semi-additive electroplated Cu lines. Other metals and methods are however also feasible, e.g. deposition by PVD of Cu, Al, Pt, . . . and patterning by wet-etching or lift-off.

L) depositing a second layer (27) of a second dielectric material as a passivation layer (FIG. 7Lx). This is preferably a second BCB coating. Other materials, inorganic or organic could also be used.

M) mechanical back grinding the wafers, such that the substrate is about 10 to 50 micrometer thicker than the actual Cu via post (FIG. 7Mx), N) plasma etching the substrate back side, stopping on the Cu/BCB plug and slightly over-etching the silicon (FIG. 7Nx), and O) solder ball (8) attachment to the Cu studs. (FIG. 7Ox)

Figure 7:
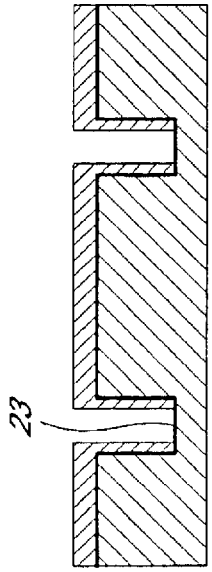
FIG. 7 represents the steps of an embodiment for a method to create isolated through holes in a substrate.
Figure 7:
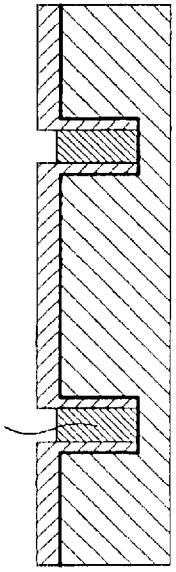
Figure 7:
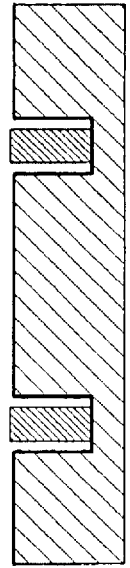
Figure 7:
Figure 7:
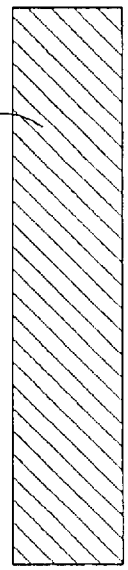
Figure 7:
Figure 7:
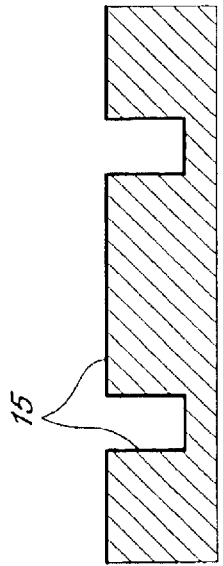
Figure 7:
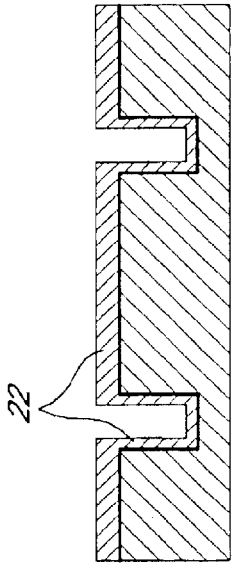
Figure 7:
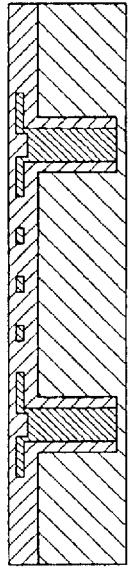
Figure 7:
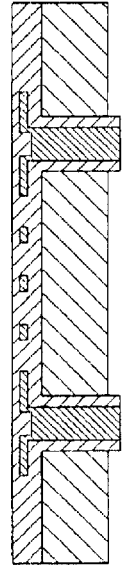
Figure 7:
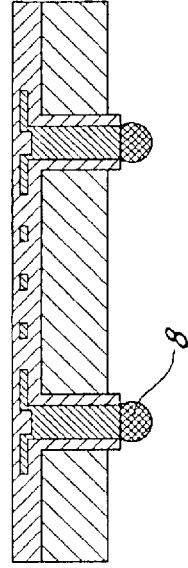
Figure 7:
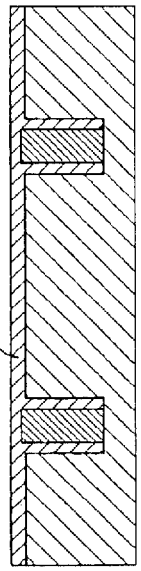
Figure 7:
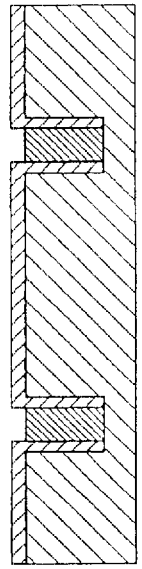
Figure 7:
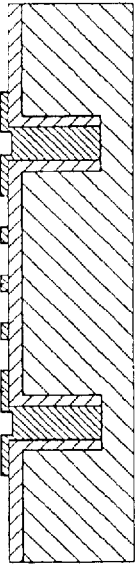
Figure 7:
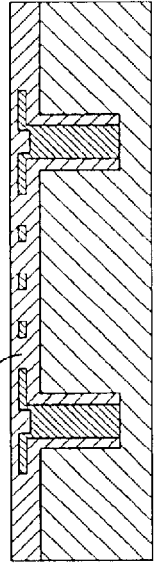
Figure 8:
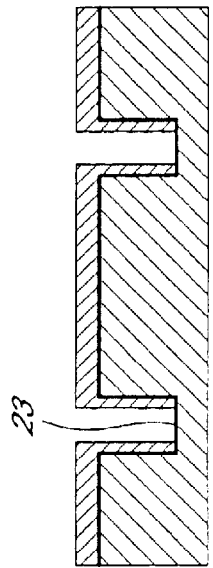
FIG. 8 represents an alternative method to that shown in FIG. 7.
Figure 8:
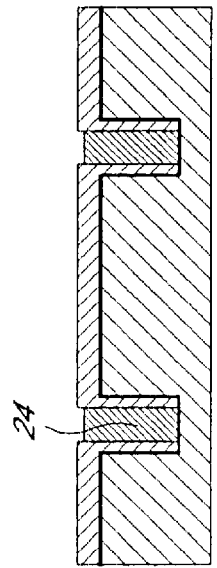
Figure 8:
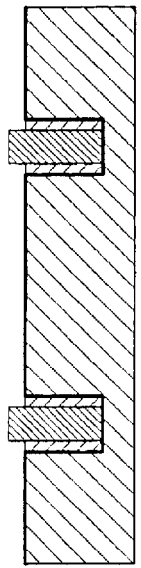
Figure 8:
Figure 8:
Figure 8:
Figure 8:
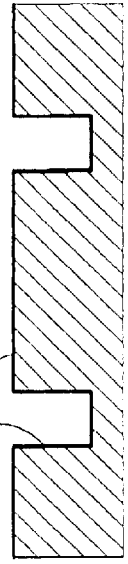
Figure 8:
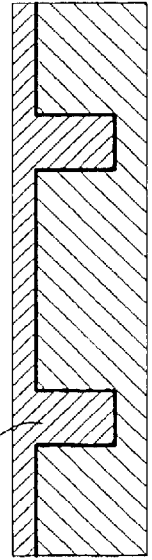
Figure 8:
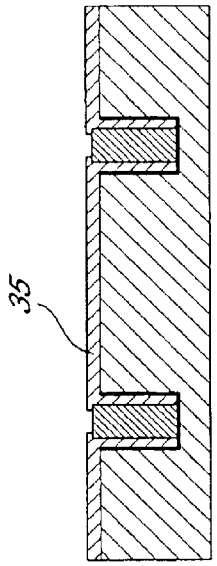
Figure 8:
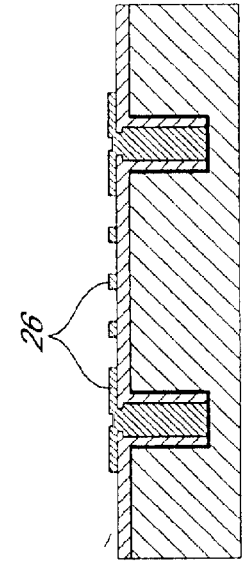
Figure 8:
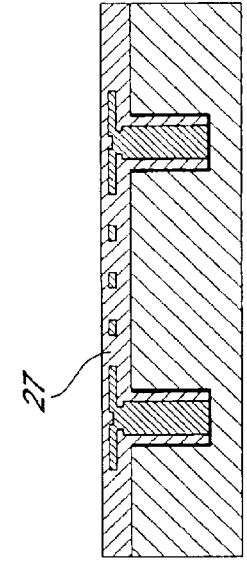
Figure 8:
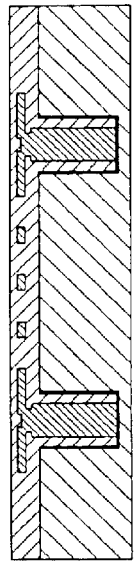
Figure 8:
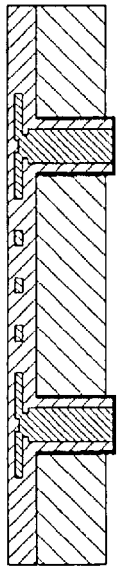
Figure 8:
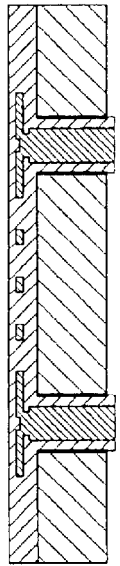
Figure 8:
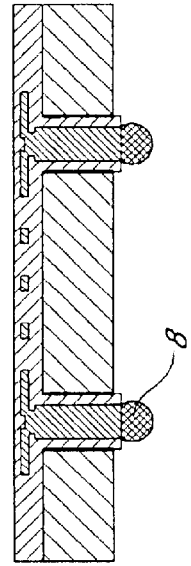

One embodiment of the invention has an advantage in connection with the through hole filling that since it is a bottom-up fill, there is no concern with respect to entrapped cavities or electrolytes when other Cu-plugs close (FIG. 7). An alternative method to make isolated through holes or vias in a substrate comprises the following steps (FIG. 8). The first three steps are as described above.

A) providing a substrate (1), preferably a Si wafer, possibly a processed Si wafer (FIG. 8A), B) dry etching said substrate, typically by RIE-ICP, forming at least one substrate hole (2). Advantageously the substrate hole is cylindrical, but other shapes are also possible. A typical hole will have a diameter of 20 to 100 micrometer and an aspect ratio (width to depth) of up to 1:5 (FIG. 8B).

C) depositing a layer of conducting material (15) on the sidewalls and the bottom of the substrate hole(s), thereby transforming said substrate hole (2) into a conductor hole, and possibly on the rest of the wafer surface. The step is preferably performed by depositing a seed layer and performing electroplating of the conducting material. Typically physical vapor deposition (PVD) of e.g. 30 nm Ti/400 nm Cu will be used, Cu being a preferable conducting material. The thickness of the Cu on the sidewalls and bottom of the holes may be increased by using electroless Cu plating. In order to avoid any contamination of the Si substrate from the Cu metallisation, a TaN barrier layer can be used instead of the Ti seed layer base (FIG. 8C).

D) depositing a planarising dielectric layer (25), filling the conductor holes and planarising the substrate. Preferably non-photo BCB is used for this step, due to its good hole-filling and planarising properties. One or multiple coatings could be required. A vacuum step can be added to ensure proper filling of the Si holes. For BCB this is preferably performed at 170° C., as this material exhibits its largest flow at that temperature, before it starts to cure at higher temperatures. An alternative method could be the lamination of a dielectric layer, followed by a vacuum reflow step, filling the holes and planarising the substrate in a single step (FIG. 8Dy).

E) plasma etching in the BCB-via fill until the conducting material (15) at the bottom (23) of the conductor hole is removed, thereby transforming the conductor hole into a dielectric hole (FIG. 8Ey). The hole may be concentric to the Si-etched hole or have arbitrary shapes (multiple holes in a single Si trough-hole).

F) bottom-up electroplating a Cu-post (24), with a thickness about equal to the depth of the Si hole. In the case of a cylindrical hole, this is a Cu cylinder (FIG. 8Fy).

G) stripping the top BCB layer by plasma etching (FIG. 8Gy),

H) stripping the layer of conducting material (the exposed seed-layer) by wet chemical etching. During this etch the Cu via-fill will be slightly etched-back (FIG. 8Hy).

I) depositing a photo-patterned dielectric layer (35), with contact openings on the Cu trough-hole fills (FIG. 8Iy). A preferred dielectric for this application is photo-BCB. Patterning by dry etching of the BCB layer, exposing the Cu-fill structures. If the layer in I is photo-defined BCB, this step will not be required.

J) depositing and patterning a metal interconnect pattern (26). This could e.g. be semi-additive electroplated Cu lines. Other metals and methods are however also feasible, e.g. deposition by PVD of Cu, Al, Pt, . . . and patterning by wet-etching or lift-off. (FIG. 8Jy).

K) depositing a second layer (27) of a second dielectric material as a passivation layer. This is preferably a BCB coating. Other materials, inorganic or organic could also be used. (FIG. 8Ky)

L) mechanical back grinding the wafers, about 10 to 50 micrometer thicker than the actual Cu via post. (FIG. 8Ly)

M) plasma etching the back side of the wafer, stopping on the Cu/BCB plug and slightly over-etching the silicon. (FIG. 8My)

N) wet etching of the exposed conductive layer (seed layer) on the back-side of the thinned wafer. During this etch the Cu via-fill will be slightly etched-back. In this case, the seed layer remains present on the sidewalls of the Silicon via hole. (FIG. 8Ny)

O) solder ball (8) attachment to the Cu studs. (FIG. 8Oy)

Polymers like BCB can be deposited at relatively low temperatures, when compared to for instance CVD Si oxide deposition. A typical prior art CVD Silicon oxide deposition step in order to create isolated through holes, is limited moreover by the characteristic of bad step coverage properties. Silicon oxide deposition produces layers with about uniform thickness, which limits design freedom. Silicon oxide can easily build up stress and is not flexible.

BCB is patternable, since it is for instance anisotropically dry or plasma-etchable. BCB is easy to process and spin and spray coatable. It has good planarization properties. BCB is flexible and low stress formation appears. BCB provides a large design freedom. Water absorption is low. Adhesion properties to substrate and conductor are present. Other properties of BCB can be found in Burdeaux et al., "Benzocyclobutene (BCB) Dielectrics for the Fabrication of High Density, Thin Film Multichip Modules.", journal of Electronic materials, Vol. 19, No. 12, 1990.

The thermo-mechanical properties of polymers and silicones are such that "flexible" and less fragile structures, more specifically interconnect structures can be created. One embodiment of the invention allows smaller pitch and thus higher density interconnects. The method according to one embodiment of the present invention provides quicker, easier and cheaper processing. While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method for the fabrication of a device comprising electrical through hole interconnects, comprising:
   (A) providing a substrate;
   (B) dry etching said substrate so as to form at least one substrate hole;
   (C) depositing a first layer of patternable dielectric material on said substrate, wherein said substrate hole is filled;
   (D) anisotropically dry etching in said first layer of patternable dielectric material within said substrate hole so as to form at least one dielectric hole within said substrate hole, wherein the sidewalls of said substrate hole remain covered with said first layer of patternable dielectric material, until the bottom of said substrate hole is reached;
   (E) depositing a layer of conducting material on the bottom and on the sidewalls of said dielectric hole so as to transform said dielectric hole into a conductor hole; and
   (F) depositing a second layer of patternable dielectric material on top of said layer of conducting material, wherein said conductor hole is filled.

2. The method according to claim 1, wherein at least two of said dielectric holes within the same said substrate hole define interconnects, between which a predetermined electromagnetic field is created when they carry a signal.

3. The method according to claim 2, wherein said dielectric holes within the same said substrate hole define an N-fold coaxial cable interconnect.

4. The method according to claim 3, wherein N equals 2.

5. The method according to claim 1, further comprising:
   (G) dry etching said substrate from the back side, until said conducting material is reached.

6. The method of claim 1, further comprising:
   performing (A)–(F) on the front side of said substrate so as to form at least one substrate hole in said front side; and
   performing (A)–(F) on the back side of said substrate so as to form at least one substrate hole in said back side, said substrate hole in said back side being aligned with said substrate hole in said front side so as to produce isolated through hole interconnects passing from said front side of said substrate to said back side of said substrate.

7. The method according to claim 1, further comprising:
   (I) anisotropically dry etching in a previous layer of patternable dielectric material within a previous conductor hole formed by a previous layer of conductive material so as to form at least one dielectric hole within said previous conductor hole, wherein the sidewalls of said previous conductor hole remain covered with said previous layer of patternable dielectric material, until the bottom of said previous conductor hole is reached;
   (J) depositing a next layer of conducting material on the bottom and on the sidewalls of said dielectric hole in said previous layer of patternable dielectric material so as to transform said dielectric hole into a conductor hole; and
   (K) depositing a next layer of a further patternable dielectric material on top of said next layer of conducting material, wherein said conductor hole is filled.

8. The method according to claim 7, further comprising performing (I)–(K) for a finite number of times, wherein optionally the back side of said substrate is thinned up until a level (LA) is high enough such that the conducting material on the bottom of said layers of conducting material is removed.

9. The method according to claim 8, further comprising performing (L)–(Q) for a finite integer number of times, wherein optionally the back side of said substrate is thinned up until a level (LB) is high enough such that the conducting material on the bottom of said layers of conducting material is removed.

10. The method according to claim 1, further comprising:
   (L) anisotropically dry etching in a previous layer of patternable dielectric material within a previous conductor hole formed by a previous layer of conductive material, forming at least one dielectric hole within said previous conductor hole, wherein the sidewalls of said previous conductor hole remain covered with said previous patternable dielectric material, until the bottom of said previous conductor hole is reached;
   (M) removing said conducting material from the bottom of said dielectric hole until said substrate is exposed on the bottom of said dielectric hole;
   (N) depositing a next layer of a further patternable dielectric material, wherein said dielectric hole is filled;
   (O) anisotropically dry etching in said next layer of patternable dielectric material within said dielectric hole so as to form a new dielectric hole within said dielectric hole, wherein the remaining portion of said dielectric hole remains covered with said next layer of patternable dielectric material, until the bottom of said substrate hole is reached;
   (P) depositing a next layer of conducting material on the bottom and on the sidewalls of said new dielectric hole in said next layer of patternable dielectric material so as to transform said new dielectric hole into a conductor hole; and (Q) depositing a next layer of a further patternable dielectric material on top of said next layer of conducting material.

11. The method according to claim 1, wherein said conducting material is copper.

12. The method according to claim 1, wherein (E) creates an interconnection with an external contact.

13. The method according to claim 1, wherein said first dielectric material, said second dielectric material and further dielectric materials are selected from the group consisting of polymer and silicone.

14. The method according to claim 13, wherein said polymer is benzocyclobutene.

15. The method according to claim 14, wherein said first dielectric material, said second and said further dielectric materials are deposited by one of the following: spin coating or spray coating or lamination.

16. The method according to claim 1, wherein said dielectric material of the first layer and said dielectric material of the second layer are the same.

17. The method according to claim 1, wherein said substrate is a processed substrate.

18. The method according to claim 1, wherein said substrate is a semiconductor substrate.

19. The method according to claim 18, wherein said substrate is a silicon substrate.

20. The method according to claim 1, wherein said substrate hole is circular shaped.

21. The method according to claim 1, wherein said dielectric hole is circular or ring shaped.

22. The method according to claim 1, wherein said dielectric hole and said substrate hole are concentric.

23. The method according to claim 1, wherein the width of said dielectric hole is between 15 $\mu$m and 40 $\mu$m.

24. The method according to claim 1, wherein patterning of said second layer of patternable dielectric material is performed by plasma-etching or lithography techniques.

25. A method for the fabrication of a device comprising electrical through hole interconnects, comprising:
   I) providing a substrate, typically covered by an oxide layer and comprising an open contact;
   J) bonding a silicon die to said substrate, wherein said silicon die has an internal contact or an internal contact is created, said internal contact being isolated by a first layer of a first dielectric material;
   K) thinning said bonded silicon die without revealing said internal contact (12);
   L) dry etching said silicon die so as to form at least one substrate hole, until said first layer of said first dielectric material in said internal contact is reached,
   M) dry etching said first layer of said first dielectric material at the bottom of said substrate hole;
   N) depositing a second layer of a second dielectric material, wherein said substrate hole is filled;
   O) depositing and patterning a thin metal hard-mask layer, and dry etching in said second layer of said second dielectric material within said substrate hole in said silicon die so as to form a dielectric hole within said substrate hole, wherein the sidewalls of said substrate hole remain covered with said second layer of said second dielectric material, until the bottom of said substrate hole is reached;
   P) depositing a thick metal layer, creating an interconnect between said open contact and said internal contact so as to transform said dielectric hole into a conductor hole, and etching said thick metal layer; and
   Q) depositing a third layer of a third dielectric material so as to fill said conductor hole.

26. The method according to claim 25, wherein said substrate is a silicon wafer.

27. The method according to claim 25, wherein said substrate hole is circular shaped.

28. The method according to claim 25, wherein said internal contact is created by flipping said silicon die with a metal pad on its upper surface, said metal pad being covered with an oxide layer.

29. The method according to claim 28, wherein the dry etching said silicon die is performed by etching through said silicon die until said oxide layer is reached.

30. The method according to claim 29, wherein the dry etching said first layer of first dielectric material is performed by etching said oxide layer.

31. The method according to claim 25, wherein said metal is aluminum.

32. The method according to claim 25, wherein said second dielectric material and said third dielectric material are benzocyclobutene (BCB) and said second layer of said second dielectric material and said third layer of said third dielectric material are deposited by BCB spin coating.

33. A method for the production of isolated through hole connects in a substrate, comprising:
   J) providing a substrate;
   K) dry etching said substrate so as to form at least one substrate hole;
   L) depositing a layer of conducting material on the bottom and on the sidewalls of said substrate hole and possibly on top of the rest of said substrate's surface so as to transform said substrate hole into a conductor hole;
   M) depositing a positive working photo resist;
   N) opening said photo resist at the bottom of said conductor hole;
   O) bottom-up electroplating a Cu-post;
   P) stripping said photo-resist;
   Q) stripping said layer of conducting material;
   R) depositing a layer of planarising dielectric material so as to fill the gap between said conductor hole and said Cu-post;
   P) depositing and patterning a metal interconnect pattern;
   Q) depositing a second layer of a second dielectric material;
   R) mechanical back grinding said substrate, such that said substrate is about 10 to 50 micrometer thicker than the actual Cu-post;
   S) plasma etching said substrate on the back side, wherein the etching stops on said Cu-post; and
   T) attaching at least one solder ball to said Cu-post.

34. The method according to claim 33, wherein said positive working photo resist is applied by spray-coating or electrophoretic deposition.

35. The method according to claim 33, further comprising patterning by dry etching said layer of planarising dielectric material, exposing said Cu-post, before applying the step of depositing, and patterning a metal interconnect pattern.

36. The method according to claim 33, wherein said substrate is a silicon wafer.

37. The method according to claim 33, wherein said substrate hole is circular shaped.

38. The method according to claim 33, wherein said conducting material is copper.

39. The method according to claim 33, wherein said planarising dielectric material and said second dielectric material are benzocyclobutene (BCB).

40. The method according to claim 33, wherein said metal interconnect pattern is formed by semi-additive electroplated copper lines.

41. The method according to claim 33, wherein in the plasma etching said substrate on the back side, said substrate is over-etched.

42. A method for the production of isolated through hole connects in a substrate comprising:

I) providing a substrate;

J) dry etching said substrate so as to form at least one substrate hole;

K) depositing a layer of conducting material on the bottom and on the sidewalls of said substrate hole and possibly on top of the rest of said substrate's surface so as to transform said substrate hole into a conductor hole;

L) depositing a layer of planarising dielectric material so as to fill said conductor hole and planarising said substrate, M) plasma etching in said layer of planarising dielectric material within said conductor hole, until the conducting material at the bottom of said conductor hole is removed so as to transform said conductor hole into a dielectric hole, N) bottom-up electroplating a Cu-post;

O) stripping said layer of planarising dielectric material;

P) stripping said layer of conducting material;

P) depositing and patterning a metal interconnect pattern;

Q) depositing a second layer of a second dielectric material;

R) mechanical back grinding said substrate;

S) plasma etching said substrate on the back side, wherein the etching stops on said Cu-post;

T) etching said layer of conductive material on the back-side of said substrate; and U) attaching at least one solder ball to said Cu-post.

43. The method according to claim 42, wherein said photo-patterned dielectric layer is photo benzocyclobutene (BCB).

44. The method according to claim 42, further comprising depositing a photo-patterned dielectric layer, with contact openings on said Cu-post, before applying the depositing, and patterning a metal interconnect pattern.

45. The method according to claim 42, wherein said substrate is a silicon wafer.

46. The method according to claim 42, wherein said substrate hole is circular shaped.

47. The method according to claim 42, wherein said conducting material is copper.

48. The method according to claim 42, wherein said planarising dielectric material and said second dielectric material are benzocyclobutene (BCB).

49. The method according to claim 42, wherein said metal interconnect pattern is formed by semi-additive electroplated copper lines.

50. The method according to claim 42, wherein in the plasma etching said substrate on the back side, said substrate is over-etched.

51. A device comprising electrical through hole interconnects fabricated by a method, wherein the method comprises:

(A) providing a substrate;

(B) dry etching said substrate so as to form at least one substrate hole;

(C) depositing a first layer of patternable dielectric material on said substrate, wherein said substrate hole is filled;

(D) anisotropically dry etching in said first layer of patternable dielectric material within said substrate hole so as to form at least one dielectric hole within said substrate hole, wherein the sidewalls of said substrate hole remain covered with said first layer of patternable dielectric material, until the bottom of said substrate hole is reached;

(E) depositing a layer of conducting material on the bottom and on the sidewalls of said dielectric hole so as to transform said dielectric hole into a conductor hole; and (F) depositing a second layer of patternable dielectric material on top of said layer of conducting material, said conductor hole being filled.

52. An electrical through hole connect produced by a method, wherein the method comprises:

(A) providing a substrate;

(B) dry etching said substrate so as to form at least one substrate hole;

(C) depositing a first layer of patternable dielectric material on said substrate, wherein said substrate hole is filled;

(D) anisotropically dry etching in said first layer of patternable dielectric material within said substrate hole so as to form at least one dielectric hole within said substrate hole, wherein the sidewalls of said substrate hole remain covered with said first layer of patternable dielectric material, until the bottom of said substrate hole is reached;

(E) depositing a layer of conducting material on the bottom and on the sidewalls of said dielectric hole so as to transform said dielectric hole into a conductor hole; and (F) depositing a second layer of patternable dielectric material on top of said layer of conducting material, said conductor hole being filled.

53. A device comprising electrical through hole interconnects, comprising:

(A) means for providing a substrate;

(B) means for dry etching said substrate so as to form at least one substrate hole;

(C) means for depositing a first layer of patternable dielectric material on said substrate, wherein said substrate hole thereby is filled;

(D) means for anisotropically dry etching in said first layer of patternable dielectric material within said substrate hole so as to form at least one dielectric hole within said substrate hole, wherein the sidewalls of said substrate hole remain covered with said first layer of patternable dielectric material, until the bottom of said substrate hole is reached;

(E) means for depositing a layer of conducting material on the bottom and on the sidewalls of said dielectric hole so as to transform said dielectric hole into a conductor hole; and (F) means for depositing a second layer of patternable dielectric material on top of said layer of conducting material, said conductor hole being filled.

* * * * *

UNITED STATES PATENT AND TRADEMARK OFFICE
CERTIFICATE OF CORRECTION

PATENT NO. : 6,908,856 B2
DATED : June 21, 2005
INVENTOR(S) : Eric Beyne and Riet Labie It is certified that error appears in the above-identified patent and that said Letters Patent is hereby corrected as shown below:

Column 15,
Line 47, after "contact" delete "(12)".

Signed and Sealed this

Eighth Day of November, 2005

JON W. DUDAS
*Director of the United States Patent and Trademark Office*